(12) United States Patent
Cao

(10) Patent No.: US 9,673,138 B2
(45) Date of Patent: Jun. 6, 2017

(54) SEMICONDUCTOR PACKAGE STRUCTURE HAVING A HEAT SINK FRAME CONNECTED TO A LEAD FRAME

(71) Applicant: Zhou Cao, Guangdong (CN)

(72) Inventor: Zhou Cao, Guangdong (CN)

(73) Assignee: GREAT TEAM BACKEND FOUNDRY (DONGGUAN), LTD., Guangdong (CN)

( * ) Notice: Subject to any disclaimer, the term of this patent is extended or adjusted under 35 U.S.C. 154(b) by 0 days.

(21) Appl. No.: 15/022,055

(22) PCT Filed: Sep. 26, 2014

(86) PCT No.: PCT/CN2014/087508
§ 371 (c)(1),
(2) Date: Mar. 15, 2016

(87) PCT Pub. No.: WO2015/043499
PCT Pub. Date: Apr. 2, 2015

(65) Prior Publication Data
US 2016/0225704 A1    Aug. 4, 2016

(30) Foreign Application Priority Data

Sep. 26, 2013 (CN) .......................... 2013 1 0443963

(51) Int. Cl.
*H01L 23/495* (2006.01)
*H01L 21/00* (2006.01)
(Continued)

(52) U.S. Cl.
CPC .... *H01L 23/49568* (2013.01); *H01L 21/4825* (2013.01); *H01L 21/4839* (2013.01);
(Continued)

(58) Field of Classification Search
CPC .......... H01L 23/49568; H01L 21/3107; H01L 21/56; H01L 21/4825; H01L 21/4839;
(Continued)

(56) References Cited

U.S. PATENT DOCUMENTS 5,822,848 A * 10/1998 Chiang ............... H01L 23/4334
257/675
6,020,649 A *  2/2000 Watanabe ............. H01L 21/565
257/706
(Continued)

FOREIGN PATENT DOCUMENTS

CN         1567585 A      1/2005
CN       103531551 A      1/2014
(Continued)

OTHER PUBLICATIONS

International Search Report, PCT/CN/2014/087508, Dec. 31, 2014.

*Primary Examiner* — Alonzo Chambliss
(74) *Attorney, Agent, or Firm* — Seth Natter; Natter & Natter

(57) ABSTRACT

A semiconductor package structure and forming method thereof; the semiconductor package structure includes a heat sink frame (2) and a lead frame (1), where the heat sink frame (2) is connected with a heat sink (4), a chip pad (21) of the lead frame (1) is adhered with a chip (3), and the heat sink (4) is connected to the chip (3) through a bonding material (5), and where the lead frame (1) is provided with a first lead (22), and the heat sink frame (2) is provided with a second lead (43) and a third lead (44). The method of forming the semiconductor package structure comprises: arranging the second lead (43) and the third lead (44) on the heat sink (4), and connecting the first lead (22) to the bottom electrode of the chip pad (21) to form a current input terminal; connecting three second lead (43) on the heat sink frame (2) to the top electrode of the chip (3) to form a current
(Continued)

output terminal; welding the third lead (44) on the heat sink frame (2) with a conductive wire to form a current control terminal, thus greatly reducing the use of conductive wires, and thus heat loss; and after injection molding, colloids are exposed on of both sides of the semiconductor package structure, thus realizing double-sided heat dissipation, and improving heat dissipation of the semiconductor package structure.

10 Claims, 4 Drawing Sheets

(51) Int. Cl.
    *H05K 7/20*     (2006.01)
    *H01L 23/31*     (2006.01)
    *H01L 23/00*     (2006.01)
    *H01L 21/48*     (2006.01)
    *H01L 21/56*     (2006.01)

(52) U.S. Cl.
    CPC ...... *H01L 21/4842* (2013.01); *H01L 23/3107* (2013.01); *H01L 23/49537* (2013.01); *H01L 23/49548* (2013.01); *H01L 23/49562* (2013.01); *H01L 24/36* (2013.01); *H01L 24/40* (2013.01); *H01L 21/56* (2013.01); *H01L 2224/32245* (2013.01); *H01L 2224/40245* (2013.01)

(58) Field of Classification Search
    CPC ........... H01L 21/4832; H01L 23/49548; H01L 23/49562
    See application file for complete search history.

(56) References Cited

U.S. PATENT DOCUMENTS

| | | | |
|---|---|---|---|
| 6,262,475 B1 | | 7/2001 | Liu |
| 6,274,408 B1 | * | 8/2001 | Watanabe .............. H01L 21/565 |
| | | | 257/E21.504 |
| 6,320,270 B1 | * | 11/2001 | Muto .................... H01L 21/565 |
| | | | 257/666 |
| 2012/0025359 A1 | * | 2/2012 | Tomaru ............... H01L 23/4334 |
| | | | 257/675 |

FOREIGN PATENT DOCUMENTS

| | | |
|---|---|---|
| CN | 203536411 U | 4/2014 |
| JP | 08181266 | 7/1996 |
| TW | 264096 B | 10/2006 |

* cited by examiner

SEMICONDUCTOR PACKAGE STRUCTURE HAVING A HEAT SINK FRAME CONNECTED TO A LEAD FRAME

CROSS-REFERENCES TO RELATED APPLICATIONS

This application claims the benefit of Chinese Patent Application No. 201310443963.4 entitled "SEMICONDUCTOR PACKAGE STRUCTURE AND FORMING METHOD THEREOF" and filed with the Chinese Patent Office on Sep. 26, 2013 by GREAT TEAM BACKEND FOUNDRY (DONGGUAN), LTD, the contents of which are incorporated herein by reference in their entirety.

TECHNICAL FIELD

The present disclosure relates to the field of the semiconductor package, in particular to a semiconductor package structure and forming method thereof.

TECHNICAL BACKGROUND

In recent years, with a higher integration level of semiconductor devices, the storage capacity, signal processing speed and power of the semiconductor devices are also higher, but the volume thereof gets smaller. As a result, this tendency speeds up the rapid development of the semiconductor integrated circuit. Among them, a lead frame is a skeleton of the semiconductor integrated circuit, and as a chip carrier of an integrated circuit or a discrete device, the lead frame is regarded as a key structural component for realizing an electrical connection between a lead-out terminal of an internal circuit of a chip and an external lead by a golden bonding wire, thereby forming an electrical circuit, and hence the lead frame functions as a bridge connected with the external wires. The lead frame mainly includes a chip pad and a lead, where the chip pad is configured to provide a mechanical support for the chip during a packaging process, and the lead is configured as an electrical pathway for connecting the chip out of the package. It is apparent that the lead frame first functions as a support for the packaged electronic device and prevents resins from surging between the leads and further supports plastics; and second functions to connect the chip to a substrate in order for providing an electrical pathway and a thermal pathway on Printed Circuit Board (PCB) of the chip. When the integrated circuit is operating, heat generation is inevitable, especially for circuits with large power consumption. As a result, it is necessary for the lead frame to have an excellent thermal conductivity in operation, thus preventing the chip from being burnt due to the large heat generation which is not undissipated immediately. The lead frame is mainly used for providing a mechanical support carrier for the chip of the integrated circuit, and further is used as a conductive medium for connecting the integrated circuit with the external circuit and transmitting electrical signals, and along with the packaging material, to emit the heat produced during the operation of the chip.

The heat is dissipated in the existing lead frames by heat sinks. However, excessive leads located on the chip would cause relatively slow heat dissipation. In addition, the combination of the existing lead frame with the heat sinks still has other defects, such as the inaccurate combination, the lower efficiency.

The Chinese utility model patent CN201629305U discloses a radiating and packaging structure of a lead frame, which includes a lead frame and a radiating fin, where through holes are arranged at the periphery of the lead frame; the radiating fin is provided with bumps matched with the through holes; and the lead frame and the radiating fin are being in the stamping and clamping connection with each other by means of the bumps and the through holes. Such a structure employs the stamping and clamping connection manner, but the heat dissipation function is limited.

The Chinese utility model patent CN202394951U discloses a heat radiating fin of a lead frame of an integrated circuit, where a groove is provided at the middle of the bottom surface of a heat radiating fin body; an insert is located in the groove and matched with the groove; and a silver layer is coated on the outer surface of the insert. However, the heat dissipation function of this heat radiating fin is also limited.

SUMMARY OF THE INVENTION

The present disclosure provides a brief and clear semiconductor package structure with better heat dissipation. In addition, the present disclosure further provides a forming method of a semiconductor package structure.

Firstly, the present disclosure provides a semiconductor package structure, the semiconductor package structure includes a heat sink frame and a lead frame, where the heat sink frame is connected with a heat sink, a chip pad of the lead frame is adhered with a chip, and the heat sink is connected to the chip through a bonding material, and where the lead frame is provided with a first lead, and the heat sink frame is provided with a second lead and a third lead.

Where, four first leads on the lead frame are connected with an bottom electrode of the chip pad and are configured as a current input terminal; three second leads on the heat sink frame are connected with a top electrode of the chip and are configured as a current output terminal; and the third lead on the heat sink frame is welded with wires, and is configured as a current control terminal.

Optionally, in order to control the accurate overlapping of the positions between the lead frame and the heat sink frame, a locating slot is provided on the lead frame and a locating lead is provided on the heat sink frame.

Optionally, in order to connect the chip pad and the heat sink with the corresponding frames and improve the connection strength, a first connection rod and a second connection rod are arranged on the lead frame and the heat sink frame, respectively.

In addition, the present disclosure provides a forming method of a semiconductor package structure, comprising the following steps:

preparing a lead frame, where a half-etched region is provided at the periphery of a chip pad of the lead frame, a first lead is connected with a chip pad to directly conduct the first lead with an electrode of the chip pad, the first lead is provided with a first solder wicking hole, and the lead frame is provide with a locating slot and a first connection rod;

welding a chip, where the chip is welded on the chip pad using bonding material;

preparing a heat sink frame, where the heat sink frame is provided with a second lead and a third lead respectively having a second solder wicking hole thereon, the heat sink frame is further provided with a second connection rod and a locating lead, and the heat sink frame is connected with a heat sink;

welding the chip to the heat sink, where the chip is welded to the heat sink using the bonding material, and the locating lead on the heat sink frame is inserted into the locating slot on the lead frame;

welding wires, where the third lead is connected to the chip through the wires to establish an conduction between the third lead and the chip;

placing into a jig and baking, where after the step of welding wires the semiconductor device is placed into the jig and then is baked by an oven, so that after baked, the bonding material is cured, thereby determining the whole height of the semiconductor device;

performing injection-molding, where, a disposable adhesive film is adhered onto the back of the lead frame so as to adhere an upper surface of the semiconductor device and a surface of the disposable adhesive film respectively to an upper surface and a lower surface of a mould, so that both the two surfaces of the semiconductor device are exposed out of a colloid from the disposable adhesive film;

performing plating, where a tin layer is plated on the first lead, the second lead, the third lead and the lead frame which are exposed out of the colloid, and accordingly the tin layer is also plated on the first solder wicking hole and the second solder wicking hole;

performing cutting molding, where excessive portions of the lead frame, the heat sink frame, the first connection rod and the second connection rod are cut off using a mould, and, excessive portions of the first lead, the second lead and the second lead are also cut off.

Optionally, the heat sink frame is provided with a supporting leg thereon for balancing the stand of the heat sink on the chip.

Optionally, in order to prevent the semiconductor device from being installed inversely since fails to differentiate the lead location of respective leads during installing, the lead frame is provided with a lead location identifying hole thereon.

In order to firmly lock the resin during the injection-molding, the heat sink frame is provided with a half-etched region at a back side and a half-etched region at a front side.

Optionally, in order to make the excessive portions of the first lead, second lead and third lead include a tin layer as much as possible, the first solder wicking hole and the solder wicking hole are located at a position where the excessive portions of the first lead, the second lead and the third lead are cut off.

Optionally, in order to increase the efficiency of the welding, in the step of welding the chip to the heat sink, one lead frame is welded with one hundred heat sinks.

The present disclosure has at least following advantages:

1) the second lead and the third lead are arranged on the heat sink, so that the number of the wires is reduced, the process is simplified and the heat dissipation is improved. In addition, the utilization of the second connection rod is reduced, thereby solving the problems relating to subsequent injection-molding and the cut-off of the second connection rod.

2) the first lead on the lead frame is connected with the bottom electrode of the chip pad and is configured as a current input terminal, three second leads on the heat sink frame are connected with the top electrode of the chip and are configured as a current output terminal, and the third lead on the heat sink frame is welded with the wires and is configured as a current control terminal, so that the number of the wires is greatly reduced, thereby reducing the heat loss.

3) After being the injection-molding, the two surfaces of the semiconductor device are both exposed out of the colloid, thereby realizing the heat dissipation on the two surfaces and further improving the heat dissipation function of the semiconductor device.

4) Via the locating slot and the locating lead, the lead frame can be controlled accurately to overlap with the heat sink frame.

5) The first solder wicking hole and the second solder wicking hole are provided so that the tin layer on the sidewall can be reserved after performing the cutting molding, thereby improving the reliability of the welding between the semiconductor device and the printed circuit board.

6) The overflow of the colloid and the crack of the chip can be effectively avoid based on the protruded height of the heat sink, the baking process after tightly pressed by the jig and the process of attaching the adhesive film to the lead frame.

DESCRIPTION OF DRAWINGS

In order to more clearly illustrate the technical solutions of the embodiments of the invention or the prior art, the drawings required for the description of the present disclosure or the prior art are briefly introduced below. Apparently, the drawings for the following description only are some embodiments of the present disclosure, and other drawings may also be obtained from the described drawings by those skilled in the art without paying out any creative work.

DETAILED DESCRIPTION OF THE PREFERRED EMBODIMENTS

The technical solutions of the embodiments of the invention are clearly and entirely illustrated in combination with the drawings of the embodiments of the invention. based on the embodiments of the invention, other embodiments obtained by those skilled in the art without any creative work belong to the scope sought to be protected by the invention.

A First Embodiment

Figure 1:
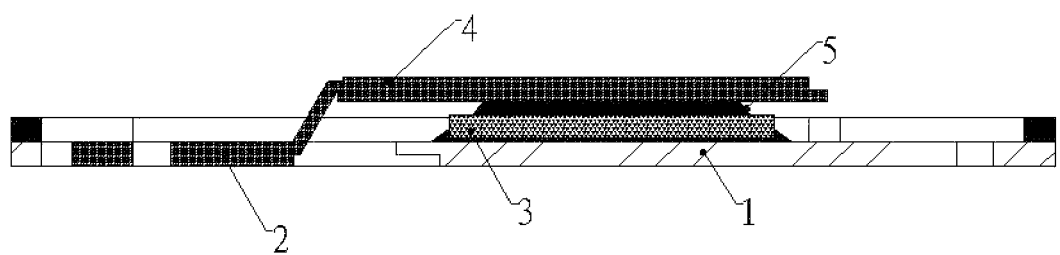
FIG. 1 is a structural diagram of a semiconductor package structure of the present disclosure.
Figure 2:
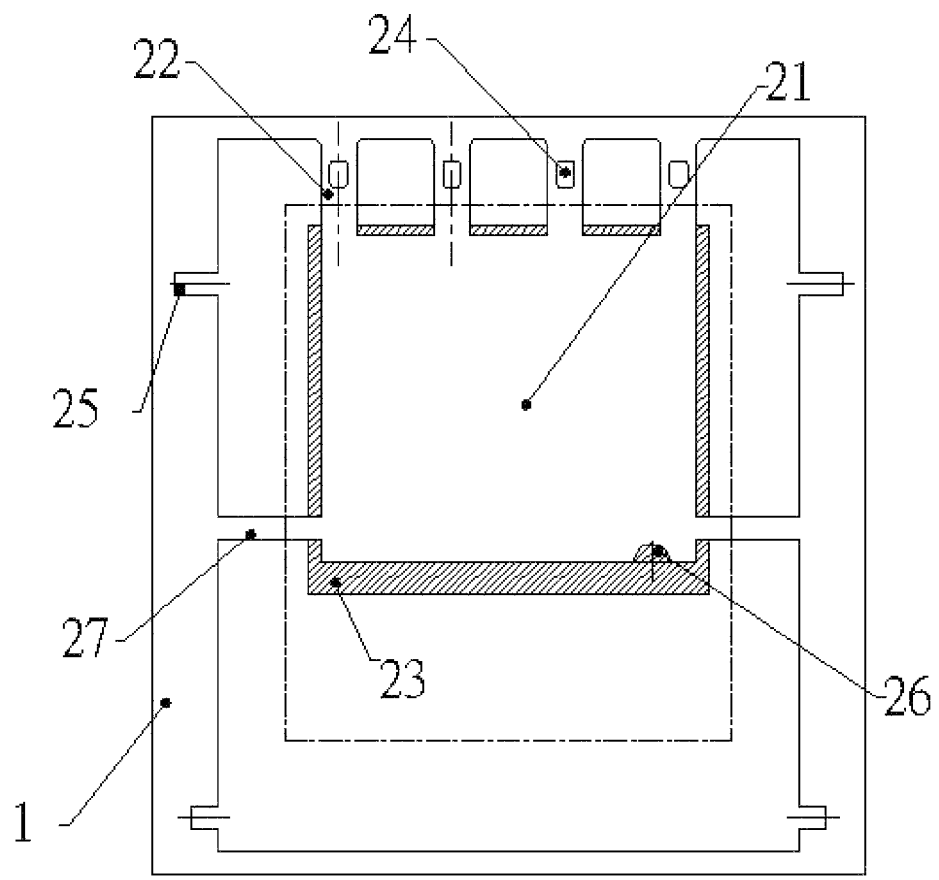
FIG. 2 is a structural diagram of a lead frame of the present disclosure.
Figure 3:
FIG. 3 is the side view of the lead frame of the present disclosure.
Figure 4:
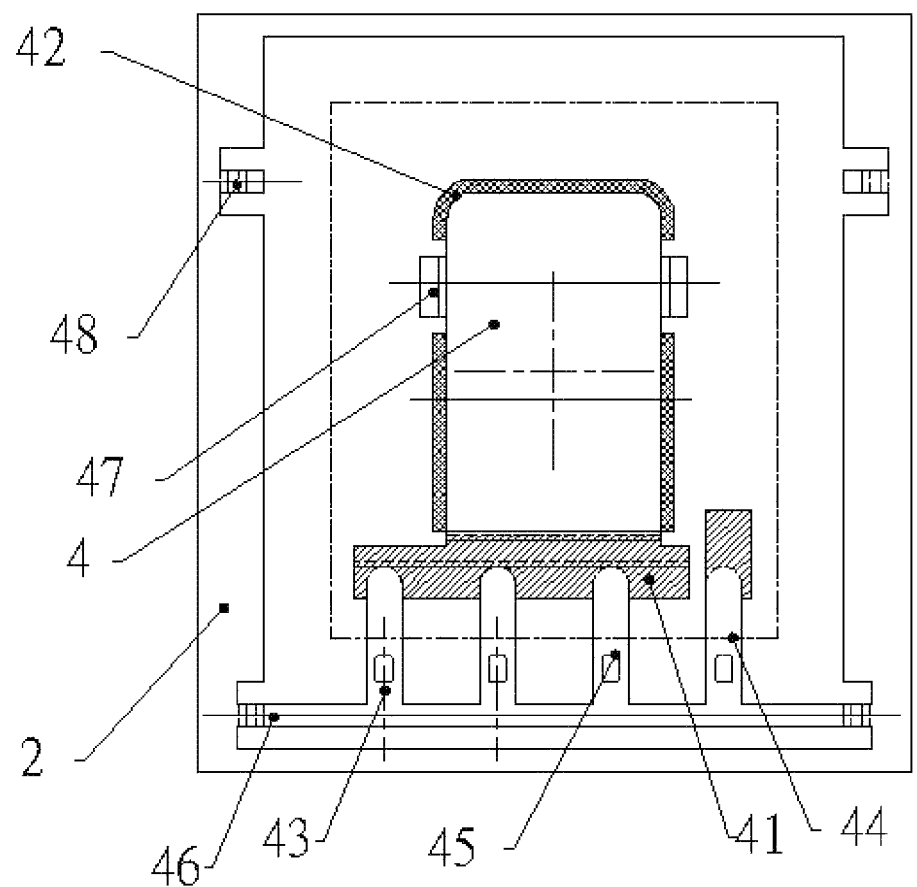
FIG. 4 is a structural diagram of a heat sink frame of the present disclosure.
Figure 5:
FIG. 5 is the side view of the heat sink frame of the present disclosure.

Referring to FIGS. 1 to 5, the present disclosure provides a semiconductor package structure, the semiconductor package structure includes a heat sink frame 2 and a lead frame 1, where the heat sink frame 2 is connected with a heat sink 4, a chip pad 21 of the lead frame 1 is adhered with a chip 3, and the heat sink 4 is connected to the chip 3 through a bonding material 5, and where the lead frame 1 is provided with a first lead 22, and the heat sink frame 2 is provided with a second lead 43 and a third lead 44.

Specifically, four first leads 22 on the lead frame 1 are connected with an bottom electrode of the chip pad 21 and are configured as a current input terminal; three second leads 43 on the heat sink frame 2 are connected with a top electrode of the chip 3 and are configured as a current output terminal; and the third lead 44 on the heat sink frame 2 is welded with wires, and is configured as a current control terminal.

Specifically, a locating slot 25 is provided on the lead frame 1 and a locating lead 48 is provided on the heat sink frame 2. More specifically, a first connection rod 27 and a second connection rod 46 are arranged on the lead frame 1 and the heat sink frame 2, respectively. The bonding material 5 is any bonding material in the prior art acknowledged by those skilled in the art, only the bonding material can realize the goal of the disclosure.

A Second Embodiment

Referring to FIGS. 1 to 5, the present disclosure provides a forming method of a semiconductor package structure, comprising the following steps:

preparing a lead frame 1, where a half-etched region 23 is provided at the periphery of a chip pad 21 of the lead frame 1, a first lead 22 is connected with a chip pad 21 to directly conduct the first lead 22 with an electrode of the chip pad 21, the first lead 22 is provided with a first solder wicking hole 24, and the lead frame 1 is provide with a locating slot 25, a lead location identifying hole 26 and a first connection rod 27;

welding a chip 3, where the chip 3 is welded on the chip pad 21 using bonding material 5;

preparing a heat sink frame 2, where the heat sink frame 2 is provided with a half-etched region 41 at a back side and a half-etched region 42 at a front side, and the heat sink frame 2 is provided with a second lead 43 and a third lead 44 respectively having a second solder wicking hole 45 thereon, the heat sink frame 2 is further provided with a second connection rod 46, a supporting lead 47 and a locating lead 48, and the heat sink frame 2 is connected with a heat sink 4;

welding the chip 3 to the heat sink 4, where the chip 3 is welded to the heat sink 4 using the bonding material 5, and the locating lead 48 on the heat sink frame 2 is inserted into the locating slot 25 on the lead frame 1;

welding wires, where the third lead 33 is connected to the chip 3 through the wires to establish an conduction between the third lead and the chip;

placing into a jig and baking, where after the step of welding wires the semiconductor device is placed into the jig and then is baked by an oven, so that after baked, the bonding material is cured, thereby determining the whole height of the semiconductor device;

performing injection-molding, where, a disposable adhesive film is adhered onto the back of the lead frame 1 so as to adhere an upper surface of the semiconductor device and a surface of the disposable adhesive film respectively to an upper surface and a lower surface of a mould, so that both the two surfaces of the semiconductor device are exposed out of a colloid from the disposable adhesive film;

performing plating, where a tin layer is plated on the first lead 22, the second lead 43, the third lead 44 and the lead frame 1 which are exposed out of the colloid, and accordingly the tin layer is also plated on the first solder wicking hole 24 and the second solder wicking hole 45;

performing cutting molding, where excessive portions of the lead frame 1, the heat sink frame 2, the first connection rod 27 and the second connection rod 46 are cut off using a mould, and, excessive portions of the first lead, the second lead and the second lead are also cut off.

It is noted that the preferable embodiments and the applied technology principles of the present disclosure are merely described as above. It should not be deemed as a limitation to the embodiment of the present invention. For those skilled in the art, without departing the conception of the present disclosure, many embodiments obtained by the simple deduce or alternation should fall in the scope protected by the invention.

The invention claimed is:

1. A semiconductor package structure, comprising:
a heat sink frame and a lead frame, wherein the heat sink frame is connected with a heat sink, a chip pad of the lead frame is adhered with a chip, and the heat sink is connected to the chip through a bonding material, and wherein the lead frame is provided with a first lead, and the heat sink frame is provided with a second lead and a third lead,
wherein the semiconductor package structure is formed by the following steps:
preparing a lead frame wherein a half-etched region is provided at the periphery of a chip pad of the lead frame, a first lead is connected with a chip pad to directly conduct the first lead with an electrode of the chip pad, the first lead is provided with a first solder wicking hole, and the lead frame is provide with a locating slot and a first connection rod:
welding a chip, wherein the chip is welded on the chip pad using bonding material;
preparing a heat sink frame, wherein the heat sink frame is provided with a second lead and a third lead respectively having a second solder wicking hole thereon, the heat sink frame is further provided with a second connection rod and a locating lead, and the heat sink frame is connected with a heat sink;
welding the chip to the heat sink, wherein the chip is welded to the heat sink using the bonding material, and the locating lead on the heat sink frame is inserted into the locating slot on the lead frame;
welding wires, wherein the third lead is connected to the chip through the wires to establish an conduction between the third lead and the chip;
placing into a jig and baking, wherein after the step of welding wires the semiconductor device is placed into the jig and then is baked by an oven, so that after baked, the bonding material is cured, thereby determining the whole height of the semiconductor device;
performing injection-molding, wherein, a disposable adhesive film is adhered onto the back of the lead frame so as to adhere an upper surface of the semiconductor device and a surface of the disposable adhesive film respectively to an upper surface and a lower surface of a mould, so that both the two surfaces of the semiconductor device are exposed out of a colloid from the disposable adhesive film;
performing plating, wherein a tin layer is plated on the first lead, the second lead, the third lead and the lead frame which are exposed out of the colloid, and accordingly the tin layer is also plated on the first solder wicking hole and the second solder wicking hole; and
performing cutting molding, wherein excessive portions of the lead frame, the heat sink frame, the first connection rod and the second connection rod are cut off using a mould, and, excessive portions of the first lead, the second lead and the second lead are also cut off.

2. The semiconductor package structure of claim 1, wherein four first leads on the lead frame are connected with an bottom electrode of the chip pad and are configured as a current input terminal; three second leads on the heat sink frame are connected with a top electrode of the chip and are configured as a current output terminal; and the third lead on the heat sink frame is welded with wires, and is configured as a current control terminal.

3. The semiconductor package structure of claim 2, wherein a locating slot is provided on the lead frame and a locating lead is provided on the heat sink frame.

4. The semiconductor package structure of claim 1, wherein a first connection rod and a second connection rod are arranged on the lead frame and the heat sink frame, respectively.

5. A method of forming a semiconductor package structure, comprising the following steps:
   preparing a lead frame, wherein a half-etched region is provided at the periphery of a chip pad of the lead frame, a first lead is connected with a chip pad to directly conduct the first lead with an electrode of the chip pad, the first lead is provided with a first solder wicking hole, and the lead frame is provide with a locating slot and a first connection rod;
   welding a chip, wherein the chip is welded on the chip pad using bonding material;
   preparing a heat sink frame, wherein the heat sink frame is provided with a second lead and a third lead respectively having a second solder wicking hole thereon, the heat sink frame is further provided with a second connection rod and a locating lead, and the heat sink frame is connected with a heat sink;
   welding the chip to the heat sink, wherein the chip is welded to the heat sink using the bonding material, and the locating lead on the heat sink frame is inserted into the locating slot on the lead frame;
   welding wires, wherein the third lead is connected to the chip through the wires to establish an conduction between the third lead and the chip;
   placing into a jig and baking, wherein after the step of welding wires the semiconductor device is placed into the jig and then is baked by an oven, so that after baked, the bonding material is cured, thereby determining the whole height of the semiconductor device;
   performing injection-molding, wherein, a disposable adhesive film is adhered onto the back of the lead frame so as to adhere an upper surface of the semiconductor device and a surface of the disposable adhesive film respectively to an upper surface and a lower surface of a mould, so that both the two surfaces of the semiconductor device are exposed out of a colloid from the disposable adhesive film;
   performing plating, wherein a tin layer is plated on the first lead, the second lead, the third lead and the lead frame which are exposed out of the colloid, and accordingly the tin layer is also plated on the first solder wicking hole and the second solder wicking hole;
   performing cutting molding, wherein excessive portions of the lead frame, the heat sink frame, the first connection rod and the second connection rod are cut off using a mould, and, excessive portions of the first lead, the second lead and the second lead are also cut off.

6. The method of forming a semiconductor package structure of claim 5, wherein the heat sink frame is provided with a supporting leg thereon for balancing the stand of the heat sink on the chip.

7. The method of forming a semiconductor package structure of claim 5, wherein the lead frame is provided with a lead location identifying hole thereon.

8. The method of forming a semiconductor package structure of claim 5, wherein the heat sink frame is provided with a half-etched region at a back side and a half-etched region at a front side.

9. The method of forming a semiconductor package structure of claim 5, wherein the first solder wicking hole and the solder wicking hole are located at a position where the excessive portions of the first lead, the second lead and the third lead are cut off.

10. The method of forming a semiconductor package structure of claim 5, wherein in the step of welding the chip to the heat sink, one lead frame is welded with one hundred heat sinks.

* * * * *